US009116258B2

(12) United States Patent
Plost

(10) Patent No.: US 9,116,258 B2
(45) Date of Patent: Aug. 25, 2015

(54) PARALLEL MULTIPOINT GEOSTATISTICS SIMULATION

(71) Applicant: Schlumberger Technology Corporation, Sugar Land, TX (US)

(72) Inventor: Brandon David Plost, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 333 days.

(21) Appl. No.: 13/653,065

(22) Filed: Oct. 16, 2012

(65) Prior Publication Data

US 2013/0262053 A1  Oct. 3, 2013

Related U.S. Application Data

(63) Continuation-in-part of application No. 13/438,697, filed on Apr. 3, 2012.

(51) Int. Cl.
*G06G 7/48* (2006.01)
*G01V 99/00* (2009.01)

(52) U.S. Cl.
CPC ........ *G01V 99/005* (2013.01); *G01V 2210/665* (2013.01)

(58) Field of Classification Search
CPC ..... G06F 17/5009; G06F 17/50; G06F 17/10; G06F 17/11; G06F 17/16; G06F 19/12; G06G 7/48; G06G 7/57; G06T 7/00
USPC ............ 703/2, 10; 713/300; 382/109; 367/86
See application file for complete search history.

(56) References Cited

U.S. PATENT DOCUMENTS

| | | | |
|---|---|---|---|
| 2006/0041410 A1* | 2/2006 | Strebelle | 703/10 |
| 2009/0164182 A1* | 6/2009 | Pedersen et al. | 703/2 |
| 2009/0259446 A1 | 10/2009 | Zhang et al. | |
| 2009/0262603 A1* | 10/2009 | Hurley et al. | 367/86 |
| 2010/0272324 A1* | 10/2010 | Hu et al. | 382/109 |
| 2011/0015909 A1* | 1/2011 | Zhao | 703/2 |
| 2011/0131425 A1* | 6/2011 | Banerjee et al. | 713/300 |
| 2011/0213600 A1 | 9/2011 | Strebelle | |
| 2011/0251833 A1 | 10/2011 | Mariethoz et al. | |

(Continued)

FOREIGN PATENT DOCUMENTS

WO     2010057505 A1   5/2010

OTHER PUBLICATIONS

Maharaja et al., "Hierarchical simulation of multiple-facies reservoirs using multiple-point geostatistics", SPE 95574, Oct. 2005.*

(Continued)

*Primary Examiner* — Kandasamy Thangavelu
(74) *Attorney, Agent, or Firm* — Alec J. McGinn

(57) ABSTRACT

A method, apparatus, and program product increase the computational efficiency of a multipoint geostatistics method by parallelizing the simulation process to concurrently simulate sets of unassigned cells in a simulation grid. Values of unassigned cells in the neighborhood of the unassigned cells being simulated are predicted, and a plurality of threads are used to simulate the set of unassigned cells using the predicted values. Simulation results are used to verify predictions, and mispredicts cause ongoing simulations of other cells to be restarted using the simulation results in lieu of mispredicted values.

25 Claims, 8 Drawing Sheets

(56) References Cited

U.S. PATENT DOCUMENTS

| | | | | |
|---|---|---|---|---|
| 2012/0136641 A1* | 5/2012 | Fung et al. | | 703/10 |
| 2012/0179436 A1* | 7/2012 | Fung | | 703/2 |
| 2013/0110484 A1* | 5/2013 | Hu et al. | | 703/10 |
| 2013/0262051 A1 | 10/2013 | Plost et al. | | |
| 2014/0012557 A1* | 1/2014 | Tarman et al. | | 703/10 |

OTHER PUBLICATIONS

Maharaja, AI., "Hierarchical simulation of multiple-facies reservoirs using multiple-point geostatistics", Stanford University, Jun. 2004.*
Strebelle, S., "Conditional Simulation of Complex Geological Structures Using Multiple-Point Statistics", Mathematical Geology, Jan. 2002.*
Journel, A. G., "Beyond covariance: the advent of multiple-point geostatistics", Geostatistic Banff, 2004.*
Tuanfeng, Z., "Incorporating Geological Conceptual Models and Interpretations into Reservoir Modeling Using Multiple-Point Geostatistics", Earth Science Frontiers, Jan. 2008.*
Comunian et al., "3D multiple-point statistics simulation using 2D training images", Computers & Geosciences, Jul. 2011.*
Hajizadeh et al., A multiple-point statistics algorithm for 3D pore space reconstruction from 2D Images, Advances in Water Resources, Jul. 2011.*
Parra et al., "Adapting a texture synthesis algorithm for conditional multiple point geostatistical simulation", Stoch Environ Res Risk Assess, May 2011.*
Parra et al., "Parallel implementation of multiple-point simulation based on texture synthesis", Ninth International Geostatistics Congress, Oslo, Norway, Jun. 2012.*
Daly, C., "A Template Searching Method for Numerical Modelling of Categorical Patterns", MSc Computer Science Project Report; School of Computer Science and Information Systems, Birbeck College, University of London, 2005, 67 pages.
Daly, C., "Higher Order Models using Entropy, Markov Random Fields and Sequential Simulation", Quantitative Geology and Geostatistics, vol. 14, 2004, pp. 215-224.
Kjonsberg, et al., "Markov Mesh Simulations with Data Conditioning ThroughIndicator Kriging", Norwegian Computing Center, Post Office Box 114, Blindern 0314 Oslo, Norway, 10 pages.
Jung et al., "Carbonate Geobodies: Hierarchical Classification and Database—A New Workflow for 3D Reservoir Modeling", Journal of Petroleum Geology.

\* cited by examiner

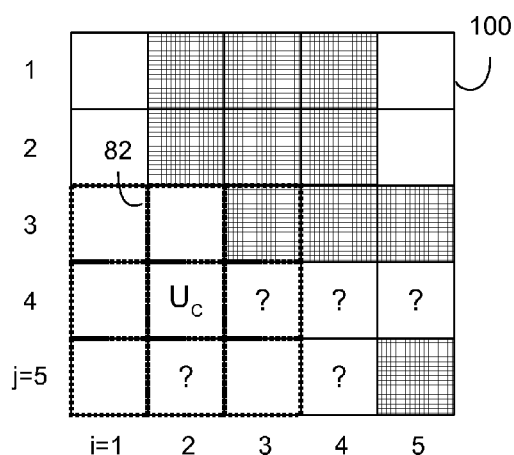
FIG. 11
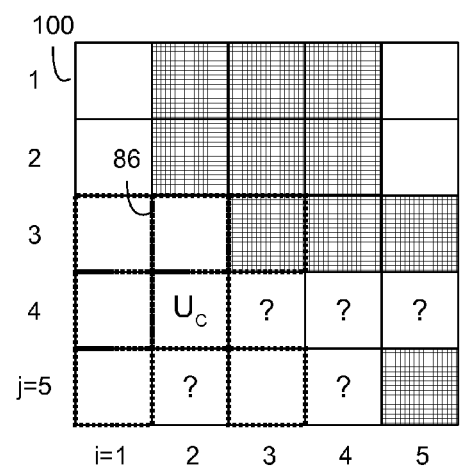
FIG. 12
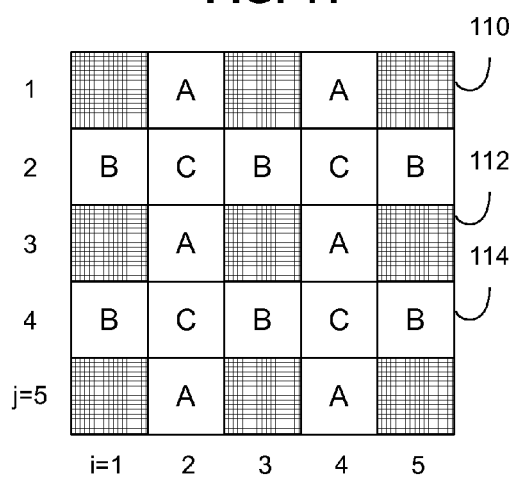
FIG. 13
FIG. 15
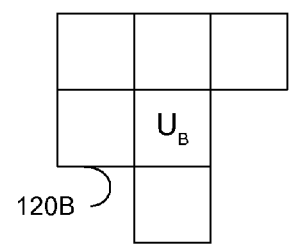
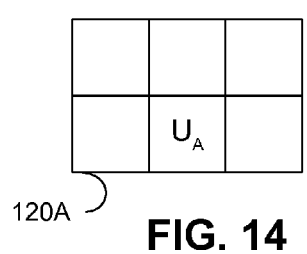
FIG. 14
FIG. 16
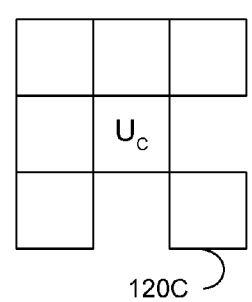

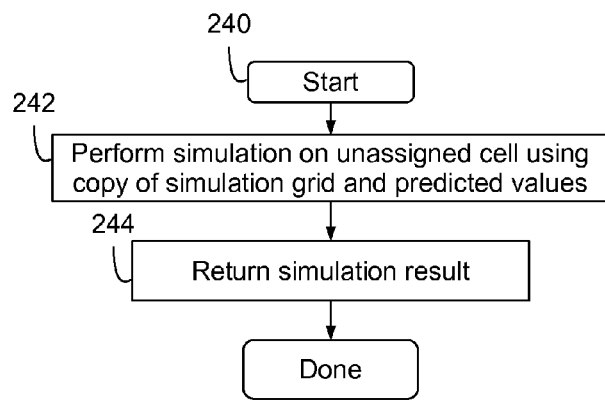
FIG. 18
FIG. 19
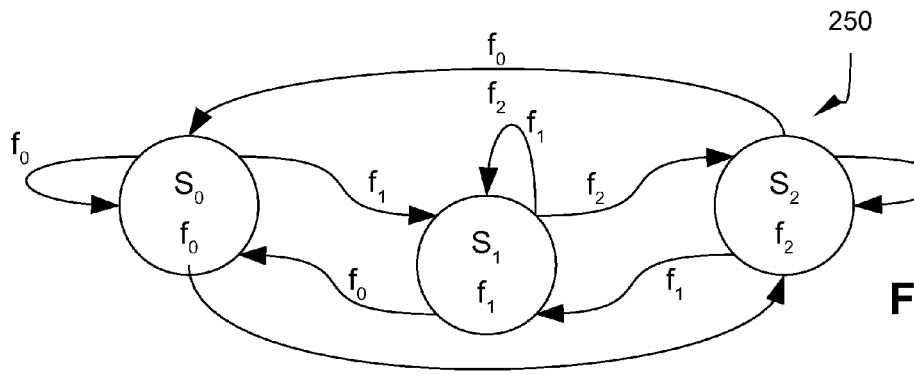
FIG. 21
FIG. 22

PARALLEL MULTIPOINT GEOSTATISTICS SIMULATION

CROSS-REFERENCE TO RELATED APPLICATIONS

This application is a continuation-in-part of U.S. Ser. No. 13/438,697 filed on Apr. 3, 2012 by Brandon David Plost et al., which application is incorporated herein by reference.

BACKGROUND

Geostatistics is a discipline concerned with spatially distributed random variables (also called "regionalized variables"), usually applied to problems in the earth sciences, such as estimation of mineral reserves and delineation of mineral deposits, hydrocarbon reservoirs, and groundwater aquifers. Typically, geostatistics makes use of two-point statistics summarized in a variogram. Multipoint (or multiple-point) geostatistics (MPS) differs from other variogram-based geostatistics primarily in that it characterizes spatial variability using patterns (sets of points and their configurations) that involve higher order (much greater than order 2) statistics.

One of the goals of multipoint geostatistics is simulation, namely the generation of numerical values along a line, on a surface, or in a volume, such that the set of values match certain given spatial correlation or structural properties (usually derived from a data set called an "analog" or "training image" or "template") while optionally (in the case called "conditional simulation") matching predetermined data. In practice, the "analog" may be, for example, a well-known rock volume that is statistically similar to a currently uncharacterized oil reservoir being delineated, and the predetermined data to be matched may be lithology observations at wells, or probabilities of lithologies derived from seismic data. MPS simulations are developed to match two types of constraints: absolute constraints are matched exactly; partial constraints are matched probabilistically, as closely as possible to the constraint value, but they are not guaranteed to match exactly. In the case of petroleum reservoir modeling, examples of absolute constraints are typically data acquired in wells or geological outcrops. Partial constraints are typically derived from seismic data; 1D, 2D, or 3D interpreted spatial trend information; geological category probability fields; or rotation and affinity (or scale) constraints on the size and direction of geological features. Such data are used in a stochastic modeling process to generate one-dimensional (ID), two-dimensional (2D), and/or three-dimensional (3D) spatial distribution of geological categories or rock properties. Since there is a random component involved in MPS simulations, individual stochastic realizations of property fields created by MPS algorithms differ, but the ensemble of realizations provide modelers with improved quantitative estimates of the spatial distribution and uncertainty of values in a modeled volume of interest.

Multipoint geostatistical methods often use a numerical training image to represent the spatial variability of geological information. The training image provides a conceptual quantitative description of the subsurface geological heterogeneity, containing possibly complex multipoint patterns of geological heterogeneity. Multipoint statistics conditional simulation anchors these patterns to well data (and/or outcrop data) and to the seismic-derived information (and/or probability field information or constraint grid(s)).

One multipoint geostatistics method, referred to as "Single Normal Equation Simulation" (SNESIM), is generally considered useful for practical applications such as modeling categorical or discrete data types, especially for categorical data in 3D property modeling. In the SNESIM method, the conditional probability density function of all categories at one point is computed using knowledge of the value at a number of nearby points and statistics provided by the training image. SNESIM works with discrete values only (i.e., a finite and usually small number of categories, such as for example five different rock types). Assume there are two categories to be simulated: A ("non-channel") and B ("channel"). The training image contains a complete representation (i.e., an example) of a spatial distribution of A and B. Assume further that the category present at 4 points, which could represent wells, is known. Conceptually, the SNESIM method computes the probability of finding categories A or B at an unsampled point by scanning the training image for all occurrences of the "pattern" (that is, the pattern is defined by the relative spatial locations of all five points, and by the categories found at the four points where a value already has been assigned). If five such pattern occurrences (called replicates) are found, and 4 out of 5 replicates show category B at the relative position of the unknown point, then the method computes the probability of B at the unknown point, given the particular five-point pattern, to be $4/5$ or 80% (while that of A is set to $1/5$ or 20%). Furthermore, the method can assign a category to the unknown point by randomly drawing a value from a distribution with 80% probability of B and 20% probability of A if there are no replicates of the four-point pattern or its sub-patterns found in the training image.

In practice, the SNESIM uses pixel-based (or voxel-based in 3D) sequential simulation method. It starts with a volume to be modeled where all property values are unassigned at all grid cell locations, or one that contains only a few data points to be matched. These volumes are usually represented by a Cartesian grid, where each grid location is called a cell. First, SNESIM decides on a random path for visiting each unassigned cell once and only once. In the first cell, the method searches for nearby known points within a search volume, usually an ellipsoid or rectangular volume around the known point. If one or more known (or already assigned) cells are found, it proceeds as to the next point on the random path as described above to find the probability of finding categories A or B at the unknown point. Armed with the probabilities for each category at the unknown point, the method randomly draws a value (category A or B) from the inferred probability distribution and assigns it to the unknown point. The process repeats at the next cell in the initially assigned random path until all cells are assigned.

The SNESIM method also provides an advantage over other MPS algorithms in that it reduces computations by storing the information for a training image in a tree-like structure to help search for a pattern in the training image. The pattern is only known on a subset of points within a neighborhood of the points to be simulated, which means that the set of locations in the training image that match the pattern generally cannot generally be found with one single search in the tree.

One alternative approach to SNESIM, referred to as a Markov mesh method, is to use a structured path instead of a random path for visiting unassigned cells. Similar to SNESIM, Markov mesh methods emulate one dimensional stationary Markov chains in that, when simulating a point, they have a 'history' of points which have been simulated already, and a 'future', which are the points that have not yet been simulated. The search neighborhood of a point to be simulated selects a subset of the points from the history. The major differences with SNESIM are due to the fact that the set of points in the search neighborhood are the same for each point to be simulated, which is important in two ways. Firstly, this makes the random function stationary, which helps with the reproduction of the training image patterns in that smaller search neighborhoods can often be used, thereby making the simulation faster. Secondly, the search neighborhood is full, which makes the tree search faster than the case of a random path, where the search needs to account for the missing cells in the search neighborhood. A unilateral path method ensures that only one traversal of the tree is needed to find the examples of the pattern within the training image as opposed to the multiple traversals needed with the random path method. The most significant problem for unilateral methods is that it is far more difficult to condition to well data, as well data points can occur in the future of points that are to simulated. While this may not be a significant problem for typical applications of unilateral methods in image analysis that do not have to account for data, it is a significant issue for applications to geological modeling where conditioning to data, in the form of wells or observations, is important.

Furthermore, the SNESIM method visits each unassigned cell in a random path, which in practice results in search neighborhoods, or a "search mask" with many unassigned cells. When an unassigned cell lies within a search mask, the calculation of the conditional probability becomes more computationally intensive due to traversal of more paths within the tree.

Moreover, the SNESIM method shows a computational drawback when simulating cells where the search neighborhood extends past the simulation grid, as in practice the method assumes all cells outside of the grid are equivalent to unassigned, not-yet-simulated, cells. Again the introduction of unassigned cells into the search neighborhood dampers the performance of the algorithm.

The SNESIM method is also typically limited to single-threaded execution. While computer technology has advanced in the area of parallelization, such that many computer workloads can be broken down into component pieces and executed in parallel using multiple hardware threads executing in multiple processing cores, processors, processing nodes and/or networked computers, the SNESIM method is not readily adapted to parallelization due to the interdependence of cell simulations. Given that the assignment of a cell is dependent upon the values assigned to neighboring cells, substantial synchronization of cell simulations would be required to ensure that individual cell simulations were based on accurate simulations of neighboring cells, effectively leading to substantial delays in threads while waiting on the results from other threads, and negating any potential gains from devoting multiple hardware threads to the simulation.

Therefore, a substantial need continues to exist in the art for an improved manner of performing geostatistics models that is less computationally intensive than conventional approaches.

SUMMARY

The embodiments disclosed herein provide a method, apparatus, and program product that increase the computational efficiency of a multipoint geostatistics method by parallelizing the simulation process using a plurality of threads. Prediction, e.g., using a discrete-value-prediction algorithm, is used to predict the value of unassigned cells in the neighborhood of a set of unassigned cells for which simulation is to be performed, and a plurality of threads, referred to herein as slave threads, are used to simulate the set of unassigned cells using the predicted values. Master program code receives simulation results from the slave threads and confirms the results against the prediction, such that in response to any misprediction, the simulations of at least a subset of the other unassigned cells in the set of unassigned cells may be restarted using the simulation result in place of the mispredicted value.

Therefore, consistent with one aspect of the invention, geostatistics modeling is performed by running a parallel multiple point statistics simulation of an n-dimensional grid by concurrently simulating cells in the n-dimensional grid using a plurality of threads to determine a simulation value to assign to each of a plurality of cells in the n-dimensional grid, prior to concurrently simulating a set of cells from among the plurality of cells, predicting values for at least a subset of the set of cells such that a first cell from among the set of cells is simulated using a predicted value for a second cell from among the set of cells, and in response to determining from simulation of the second cell that the predicted value for the second cell was mispredicted, restarting simulation of the first cell with the predicted value for the second cell replaced with a simulation value determined from simulation of the second cell.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

BRIEF DESCRIPTION OF THE DRAWINGS

FIG. 11 illustrates an example simulation grid, which uses two multigrids and is partially simulated, and upon which is overlaid the symmetric square search mask of FIG. 6.

FIG. 12 illustrates the example simulation grid of FIG. 11, but upon which is overlaid the non-symmetric search mask of FIG. 8.

FIG. 13 illustrates an example simulation grid including two multigrids and three subgrids defined in one of the multigrids, and suitable for use in the system of FIG. 1.

FIGS. 14-16 illustrate examples of non-symmetric search masks in two dimensions, and suitable for use with the subgrids of FIG. 13.

FIG. 18 illustrates an example simulation grid for use with a single threaded simulation.

FIG. 19 illustrates the example simulation grid of FIG. 18, but with which a multithreaded simulation may be performed.

FIG. 21 is a flowchart illustrating the program flow of a simulation routine capable of being executed by a slave thread in the system of FIG. 1.

FIG. 22 is a state diagram illustrating a dynamic discrete-value prediction algorithm for use by the simulation routine of FIG. 21.

DETAILED DESCRIPTION

Figure 1:
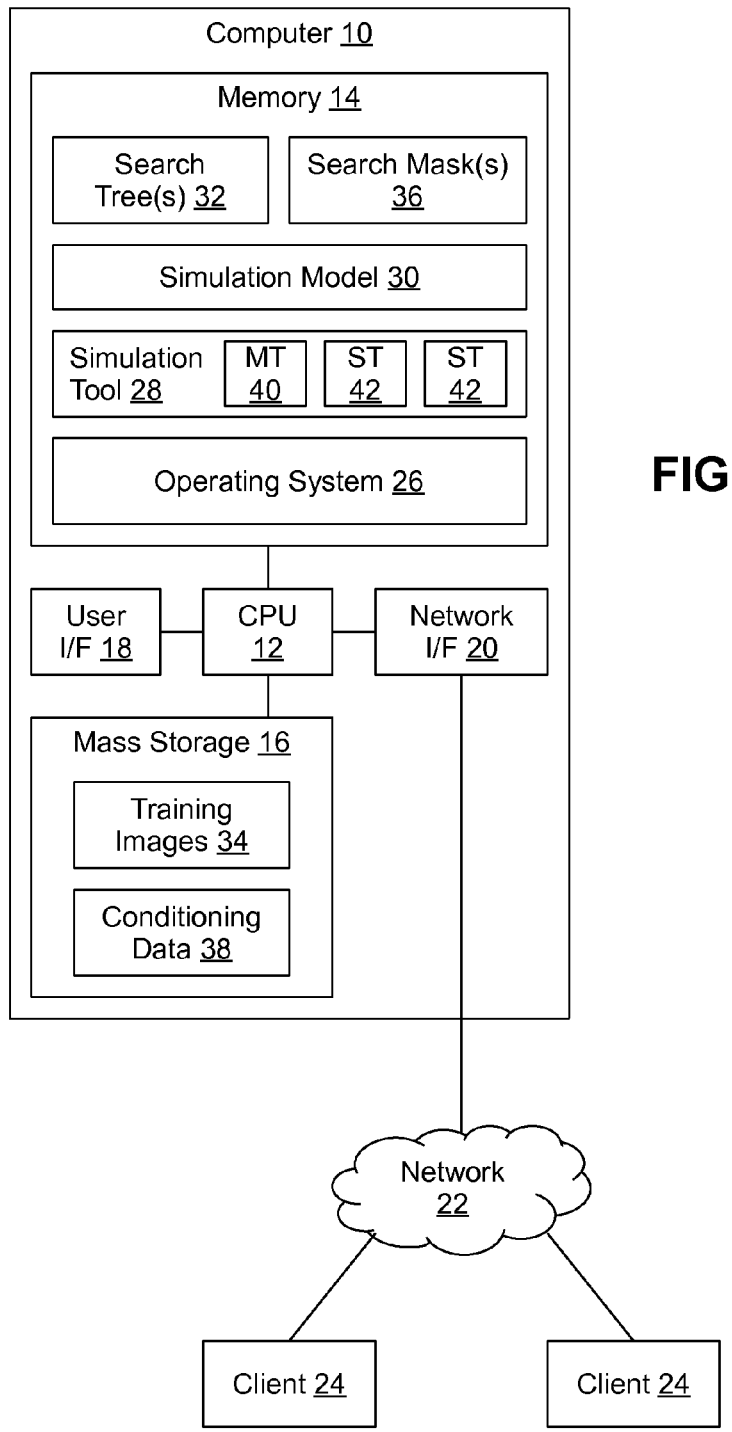
FIG. 1 is a block diagram of an example hardware and software environment for a data processing system suitable for implementing an ordered multipoint geostatistics simulation with non-symmetric search mask(s).

The herein-described embodiments invention provide in one aspect a method, apparatus, and program product that increase the computational efficiency of a multipoint geostatistics method by employing an ordered path through unassigned cells in combination with a non-symmetric search mask that excludes one or more not-yet-simulated cells from the search mask during simulation.

As will become more apparent below, the exclusion of not-yet-simulated cells from a search mask reduces accesses to a search tree during simulation because probabilities for neighboring cells that are as-yet not simulated are not calculated when simulating a given cell. A search mask, in this regard, refers to a search neighborhood that surrounds a cell being simulated, and refers to the neighboring cells that are utilized to simulate a given cell. As opposed to a symmetric search mask, which typically is symmetrical about in one or more dimensions and extends a predetermined number of cells in one or more dimensions around a cell being simulated (e.g., for a two a dimensional search mask, a square, rectangle, circle or ellipse, or for a three dimensional search mask, a sphere, a cube, an ellipsoid, or a rectangular prism), a non-symmetrical search mask omits one or more cells from a symmetric search mask for which it is known will not already have been simulated when the cell under simulation (e.g., located at the center of the search mask) is simulated.

Put another way, because an ordered path is utilized during simulation, the search masks utilized during simulation may be effectively conditioned to the data, and exclude cells from the search mask that have not yet been simulated. In this regard, simulating in a predetermined order, i.e., using an ordered path, refers to a non-random and non-pseudorandom order that is determined prior to simulation. In one embodiment, for example, the predetermined order may be a sequential order, although other embodiments may utilize non-sequential, yet still ordered paths during simulation.

In some embodiments, an ordered path and non-symmetrical search masks may be utilized in connection with multigrids, such that an ordered path is used both when simulating different multigrids and when simulating within given multigrids. A multigrid, in this regard, refers to a coarser grid in which collections of every nth cell in each dimension are collectively treated as a grid, and are simulated prior to simulating either individual cells or simulating one or more finer multigrids (e.g., n/2 multigrids). Furthermore, as will become more apparent below, in some embodiments multigrids may be enforced only in a subset of dimensions for the grid of cells being simulated, e.g., in a three dimensional grid with dimensions i, j and k, where k is vertical to the Earth, multigrids may be enforced in only the i and j dimensions.

In addition, in some embodiments, multiple subgrids may be defined within each multigrid, with separate subgrid-specific non-symmetrical search masks defined for each subgrid such that simulation of the cells within a multigrid may alternate between the multiple subgrids when following the ordered path, rather than simulating each subgrid separately within a multigrid. An ordered path through the multigrid may be utilized, with a different search mask selected for each cell based upon the subgrid to which the cell is assigned.

Furthermore, in some embodiments, computational efficiency may be further improved when simulating cells proximate the boundaries of the simulation grid by padding the simulation grid with additional cells and assigning values to neighboring cells in a search mask based upon the overall occurrences, within a training image, of the different possible values that may be assigned to the cell being simulated.

The herein-described embodiments invention also provide in another aspect a method, apparatus, and program product that increase the computational efficiency of a multipoint geostatistics method by parallelizing simulation using a plurality of threads to concurrently simulate a plurality of unassigned cells. The plurality of threads determine simulation values to assign to each of a plurality of cells in an n-dimensional grid. In addition, prior to concurrently simulating a set of cells from the plurality of cells, predicted values, e.g., using a discrete-value-prediction algorithm, are predicted for at least a subset of the set of cells such that each thread is capable of utilizing the predicted values when performing a simulation. When simulated values are returned, the simulation values are compared to the predicted values, and in response to determining that any predicted value was mispredicted, simulation of any cells for which simulation results have yet to be returned is restarted such that simulation values may be used in lieu of any mispredicted predicted values.

Other variations and modifications will be apparent to one of ordinary skill in the art.

Hardware and Software Environment

Turning now to the drawings, wherein like numbers denote like parts throughout the several views, FIG. 1 illustrates an example data processing system 10 in which ordered multipoint geostatistics simulation using a non-symmetric search mask may be implemented. System 10 is illustrated as including one or more computers, each including a central processing unit 12 including at least one hardware-based microprocessor coupled to a memory 14, which may represent the random access memory (RAM) devices comprising the main storage of computer 10, as well as any supplemental levels of memory, e.g., cache memories, non-volatile or backup memories (e.g., programmable or flash memories), read-only memories, etc. In addition, memory 14 may be considered to include memory storage physically located elsewhere in computer 10, e.g., any cache memory in a microprocessor, as well as any storage capacity used as a virtual memory, e.g., as stored on a mass storage device 16 or on another computer coupled to computer 10.

Computer 10 also typically receives a number of inputs and outputs for communicating information externally. For interface with a user or operator, computer 10 typically includes a user interface 18 incorporating one or more user input devices, e.g., a keyboard, a pointing device, a display, a printer, etc. Otherwise, user input may be received, e.g., over a network interface 20 coupled to a network 22, from one or more clients 24. Computer 12 also may be in communication with one or more mass storage devices 16, which may be, for example, internal hard disk storage devices, external hard disk storage devices, storage area network devices, etc.

Computer 10 typically operates under the control of an operating system 26 and executes or otherwise relies upon various computer software applications, components, programs, objects, modules, data structures, etc. For example, to implement ordered multipoint geostatistics simulation using a non-symmetric search mask, a simulation tool 28 may be used to generate a simulation model 30 using one or more search tree 32 derived from one or more training images 34, and using one or more search masks 36, some or all of which may be non-symmetrical in nature. In addition, simulation tool 28 may use conditioning data 38, e.g., well data, outcrop data, core sample data, seismic-derived data, probability field data, and/or constraint grids to constrain the model according to known lithologies.

In addition, as will be discussed in greater detail below, simulation tool may include at least one master thread 40 and a plurality of slave threads 42 configured to concurrently execute on a variety of multithreaded computer architectures, e.g., including a plurality of hardware threads, processors, processor cores, processing nodes, and/or computers, and thereby implement a parallel multiple point statistics simulation. Threads 40, 42 may be disposed in the same process or in different processes, and at least a portion of the threads may be executed on the same hardware thread using time slicing. Other hardware, software, network and/or operating system configurations capable of implementing multithreading or parallel processing may be used in the alternative, so the invention is not limited to the particular parallel architectures disclosed herein.

In general, the routines executed to implement the embodiments disclosed herein, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying desired functionality. Moreover, while embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 10. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the example environment illustrated in FIG. 1 is not intended to limit the invention. Indeed, those skilled in the art will recognize that other alternative hardware and/or software environments may be used without departing from the scope of the invention.

Ordered Multipoint Geostatistics Simulation Using Non-Symmetric Search Mask

As discussed above, multipoint geostatistics simulation may be performed using an ordered path and one or more non-symmetric search masks to improve the computational efficiency of the simulation. In one example embodiment, for example, a computer-implemented multipoint geostatistics simulation may be implemented in computer 10 of FIG. 1, and may employ an ordered (as opposed to random) path through unassigned cells in a simulation grid, where the path includes the following characteristics:

(a) cells are simulated using a multiple grid (multigrid) approach. All cells on a coarser multigrid are simulated before any cells on a finer multigrid.

(b) multigrids are enforced in the i and j directions but not the k (vertical into the Earth) direction, e.g., for multigrid n, spacing is defined as $(i, j, k) = (2n, 2n, 1)$.

(c) cells are simulated in-order within each multigrid, e.g., by starting from the top layer (in the k direction), simulating all cells in one layer in reading order, left-to-right then top-to-bottom, before moving on to the next layer.

Figure 2:
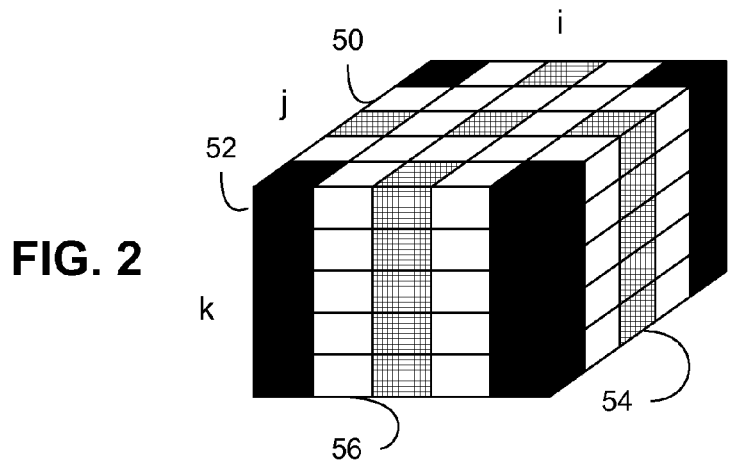
FIG. 2 is a perspective view of an example implementation of multigrids enforced in only a subset of the dimensions of a three-dimensional simulation grid.
Figure 3:
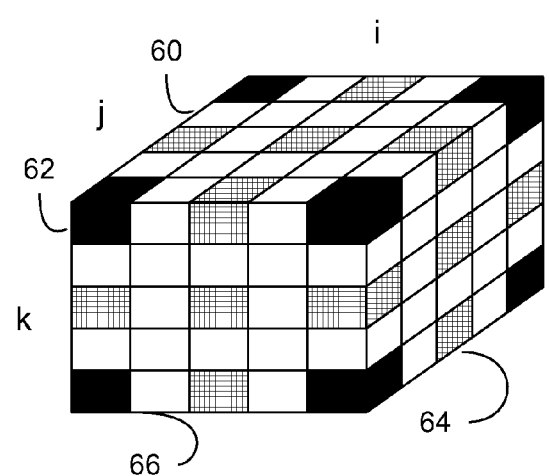
FIG. 3 is a perspective view of an example implementation of multigrids enforced all of the dimensions of a three-dimensional simulation grid.

FIG. 2 illustrates characteristics (a) and (b) above by way of an example three-dimensional simulation grid 50 having i, j and k dimensions (with k being vertical into the Earth), in which cells are simulated using three multigrids. The coarsest multigrid 52, represented by the black cells, has a spacing of four cells, while the next coarsest multigrid 54, represented by the cross-hatched cells, has a spacing of two cells. The finest multigrid 56 is represented by the white cells. Notably, in this embodiment, the multigrids 52, 54, 56 are enforced only in the i and j directions, and not in the k direction. More generally, in some embodiments, where the simulation grid has n dimensions, only a subset of the dimensions, e.g., n−1 dimensions, may have multigrids enforced thereupon. Alternatively, as illustrated in FIG. 3, multigrids 62, 64, 66 may be enforced in all three dimensions i, j and k, so the invention is not limited to the implementation illustrated in FIG. 2.

Figure 4:
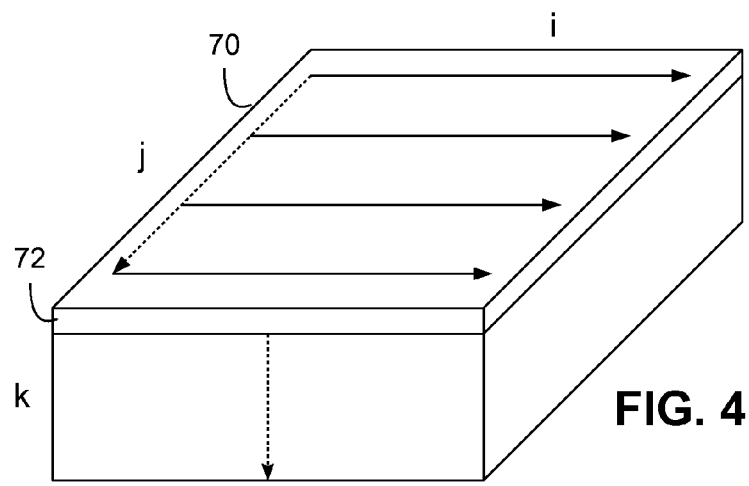
FIG. 4 is a perspective view of an example ordered path through unassigned cells in a multigrid in the system of FIG. 1.

FIG. 4 illustrates characteristic (c) above by way of an example, three-dimensional simulation grid 70 having i, j and k dimensions (with k being vertical into the Earth), in which cells are simulated in-order within each multigrid, e.g., by starting from the top layer 72 (in the k direction), simulating all cells in one layer in reading order, left-to-right then top-to-bottom, before moving on to the next layer. It will be appreciated that other predetermined orders may be used to simulate cells, including both sequential orders and non-sequential orders that are non-random or non-pseudorandom in nature.

For each cell being simulated along the aforementioned ordered path, a simulation algorithm, similar to that utilized in conventional multipoint simulations, is utilized to simulate a value for the cell. In one embodiment, the algorithm compares values determined for neighboring cells, identified in a search mask, to similar neighborhoods in a training image and determines a conditional probability of which value belongs in the cell being simulated. Using this probability, the algorithm picks, using a random number generator, a value for that cell. Once a value for a cell is assigned, it does not change in that simulation.

In the example embodiment discussed below, the value for a cell refers to a classification of the cell as meeting a certain characteristic, e.g., as being a certain facies of rock. In this example, two possible values, e.g., cell is (value=1) or is not (value=0) a certain facies. It will be appreciated, however, that more than two values may be simulated for each cell using the herein-described techniques in other embodiments, and that geostatistics other than facies may be simulated.

In one embodiment, the simulation algorithm utilizes a non-symmetric search mask, or search neighborhood, when simulating at least a portion of the cells in a simulation grid. By way of comparison, FIGS. 5 and 6 respectively illustrate two-dimensional symmetric search masks 80, 82. Search mask 80 of FIG. 5 defines a circle with a radius of one cell, while search mask 82 of FIG. 6 defines a square with a radius of one cell. In three dimensions, these search masks would translate to an ellipsoid or a rectangular prism. In some embodiments, the size of said search mask, e.g., in terms of radius, length, width, diameter, etc., may be defined by the user, and may be fine tuned for any data set. Search masks 80, 82 as illustrated are symmetric in each dimension and extending equidistantly in each dimension, although it will be appreciated that a search mask may be extend different numbers of cells in different dimensions and still be symmetric in nature.

Figure 7:
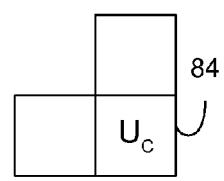
FIG. 7 illustrates an example non-symmetric search mask in two dimensions, and suitable for use in the system of FIG. 1.
Figure 8:
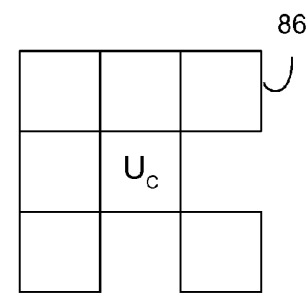
FIG. 8 illustrates another example non-symmetric search mask in two dimensions, and suitable for use in the system of FIG. 1.

The herein-described embodiment, however, utilize one or more non-symmetric search masks, e.g., non-symmetric search masks 84, 86 of FIGS. 7 and 8, to exclude one or more not-yet-simulated cells from the search masks and thereby eliminate those cells from the simulation, as it has been found that, in practice, if there is an unassigned cell that falls within the range of a search mask, the calculations to determine the conditional probability are more difficult and more computationally intensive, so eliminating such unassigned cells from the simulation can improve computational efficiency without substantially affecting the accuracy of the overall simulation. Moreover, since simulation grids usually start off empty (or with less than 5% of the cells assigned), throughout most of the simulation process there are many unassigned cells that may appear in a symmetric search mask, thereby making the computation of conditional probabilities extremely slow for many of the cells in a simulation grid.

Figure 5:
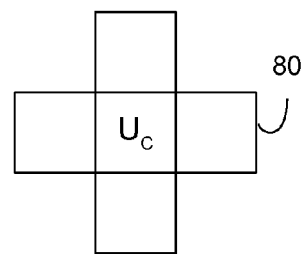
FIG. 5 illustrates an example symmetric circular search mask in two dimensions, and suitable for use in the system of FIG. 1.
Figure 9:
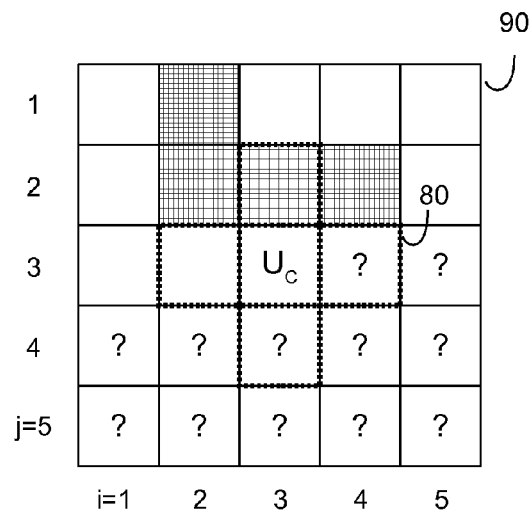
FIG. 9 illustrates an example simulation grid, which does not use multigrids and is partially simulated, and upon which is overlaid the symmetric circular search mask of FIG. 5.
Figure 10:
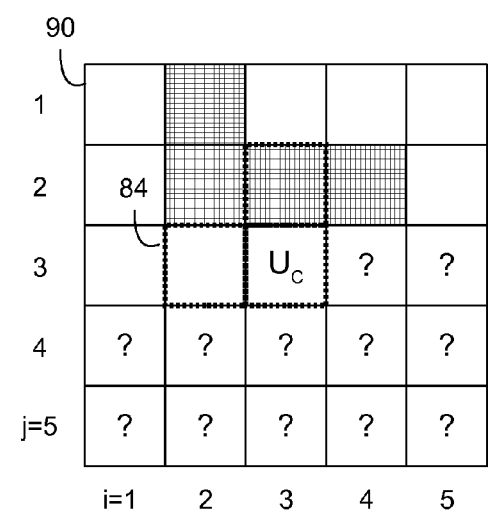
FIG. 10 illustrates the example simulation grid of FIG. 9, but upon which is overlaid the non-symmetric search mask of FIG. 7.

As noted above, FIG. 5 illustrates a circular symmetric search mask 80 of radius 1 and size 3×3. The cell labeled $U_c$ is the center of the search mask, and during simulation the mask is placed with the center corresponding to the next cell to be simulated. FIG. 9, for example, depicts a 5×5 two-dimensional simulation grid 90 that is partially simulated without any multigrids (for simplicity), with two different facies, valued 0 (white cells) and 1 (cross-hatched cells). Unsimulated cells are designated as "?". While simulating in order, if symmetric search mask 80 of FIG. 5 is placed onto the next cell to be simulated (designated as $U_c$ in FIG. 9), two of the four cells that fall in the search mask are unassigned. However, as shown in FIG. 10, using a non-symmetric search mask such as search mask 84 of FIG. 7, there are no unassigned cells in the search mask. Even though both search masks 80, 84 capture the same information, the computation to determine probability on unassigned cells is more computationally intensive than just using a search mask that excludes them.

Moreover, when using multigrids, a non-symmetric search mask may provide additional improvements in computational efficiency. Returning to FIGS. 2 and 3, FIG. 3 illustrates three multigrids 60, 62, 64 enforced in all dimensions on a 5×5×5 grid 60. In practice, however, i, j, and k are not relatively equal—normally i and j are orders of magnitude larger than k. Thus, in some embodiments, multigrids may be defined in only two of the three dimensions, as in FIG. 2, enabling search masks to be defined in two dimensions, with scaling to three dimensions substantially simplified (just stack copies of the same cells on top of one another to scale to the third dimension).

To simplify the further discussion, the concepts embodied in the described embodiments will be described in two dimensional space, but it will be appreciated that these concepts easily scale to three dimensional space. Furthermore, multigrids will be described abstractly, because it will be appreciated that any n number of multigrids may be used for scanning a training image and subsequently simulating a grid. Note that typically two consecutive multigrids can be reduced to rectangles, so the discussion hereinafter will focus on two multigrids at a time, with the understanding being that the relationship can expand to any number of multigrids.

Figure 6:
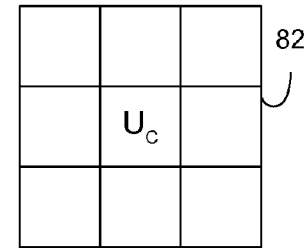
FIG. 6 illustrates an example symmetric square search mask in two dimensions, and suitable for use in the system of FIG. 1.

FIG. 11 illustrates an example 5×5 simulation grid 100 using two multigrids. The coarser multigrid has already been simulated and the finer multigrid is only partially simulated. FIG. 6 illustrates a symmetric 3×3 square search mask 82, and if this search mask is used in the simulation from FIG. 11, it can be seen that there are six informed cells in the search mask and two uninformed cells in the search mask. However, as illustrated in FIG. 12, using a non-symmetric search mask (such search mask 86 of FIG. 8), it can be seen that there are exactly six neighbors in the search mask and all of them are already assigned in the simulation.

Because it is known the order in which the cells will be simulated, the shape of the search mask may be tailored to which cells will be informed at simulation time. Moreover, in embodiments where a search tree is used to find matching patterns in a training image, the configuration of the search mask may be used to generate a search tree optimized for matching patterns corresponding to the search mask in the training image. Furthermore, where multiple search masks are used, multiple search trees, each optimized for a particular search mask, may be generated and utilized during the simulation of cells in a simulation grid.

Now turning to FIGS. 13-16, it may be desirable in some embodiments to define multiple subgrids within a multigrid. FIG. 13, for example, illustrates a 5×5 simulation grid 110 incorporating multigrids 112 (cross-hatched cells) and 114 (white cells). Within multigrid 114 are defined three subgrids A, B and C. In this embodiment, from the perspective of simulation, the ordering of the subgrids does not matter, and the subgrids may even be concurrently simulated by simulating the cells in the multigrid sequentially, but using different search mask topologies, e.g., as shown in FIGS. 14-16, to accommodate the locations of previously simulated cells from earlier multigrids. In other embodiments, however, the subgrids may be simulated sequentially (e.g., simulate all cells in subgrid A, then all cells in subgrid B, and then all cells in subgrid C).

FIGS. 14, 15 and 16 respectively illustrate search masks 120A, 120B and 120C for use respectively with subgrids A, B and C in connection with concurrent simulation of these subgrids. Note that for each of the masks, all points above the center, and directly left of the center cell are included. As simulation proceeds in order, and assuming that the other multigrid 112 (cross-hatched cells) is already simulated, all of the cells in the respective search masks will be assigned no matter which subgrid the cell is in. The rest of the cells that are in the search masks depend only on the subgrid cells' position in relation to the previous multigrid (as all previous multigrid cells are contained in it). The concurrent simulation of the subgrids therefore proceeds by alternating between the A, B and C subgrids as a sequential order is followed through the multigrid and using the subgrid-specific search masks for those subgrids Also, since there are no previous multigrids for multigrid 112, in this embodiment no subgrids are defined for the coarsest multigrid during simulation. Search masks for this multigrid may be configured to include only the cells above (in 2 dimensions) and directly to the left of the center cell.

It is also important to note that, by implementing the aforementioned, hybrid approach, using a sequential path, multigrids, subgrids and subgrid-specific search masks, the simulation is well suited to condition to previously acquired data (should any such data exist), and in some embodiments, nothing separate need be done during the simulation process to condition data. If a cell is already filled in with conditioning data when the algorithm attempts to simulate the cell, the algorithm may just skip the cell and proceed to the next cell. From that point forward the algorithm then uses the conditioning data in search masks for nearby cells, thus incorporating the conditioning data into the final simulation.

The herein-described embodiments thus attempt to reduce or otherwise minimize the amount of unassigned cells that appear within a search mask. In some embodiments, additional gains may be obtained by accommodating the boundary cases of a simulation algorithm. For example, when a search mask is larger, e.g., 10×10 in two dimensions, there are many cells on any simulation grid for which the search mask lies partially outside of the boundary of the grid. This still may be true even when using a non-symmetric search mask (though the number of unknown cells may be lower since the number of cells in the search mask is also lower). Whereas cells outside of a simulation grid may be treated as unassigned cells, doing so has been found to reduce performance.

In some embodiments, however, predicted values may be assigned to the cells outside of the simulation grid to reduce or eliminate the number of unassigned cells encountered in a search mask. In one embodiment, for example, predicted values may be based on the overall or global probability of each category being simulated, e.g., each facies type. When scanning a training image to create the search trees, the overall probability of each facies type may be determined. For example, suppose there is a training image with 100 cells, and using colors to represent different facies types, 50 are gray, 30 are blue, and 20 are red. In that example, the probabilities for each facies type may be determined to be 0.5 for gray, 0.3 for blue, and 0.2 for red. Then, during the simulation, if the search mask is partially outside of the simulation grid, the values of these outlying cells in the search mask may be randomly assigned values based on the probabilities recorded for each facies type.

In addition, in some embodiments, since choosing random values may potentially create odd effects on the boundaries of the grid, additional "padding" cells may be simulated on each side of the grid to counter these effects. Various padding sizes may be used, e.g., a single cell on each side of the grid.

Figure 17:
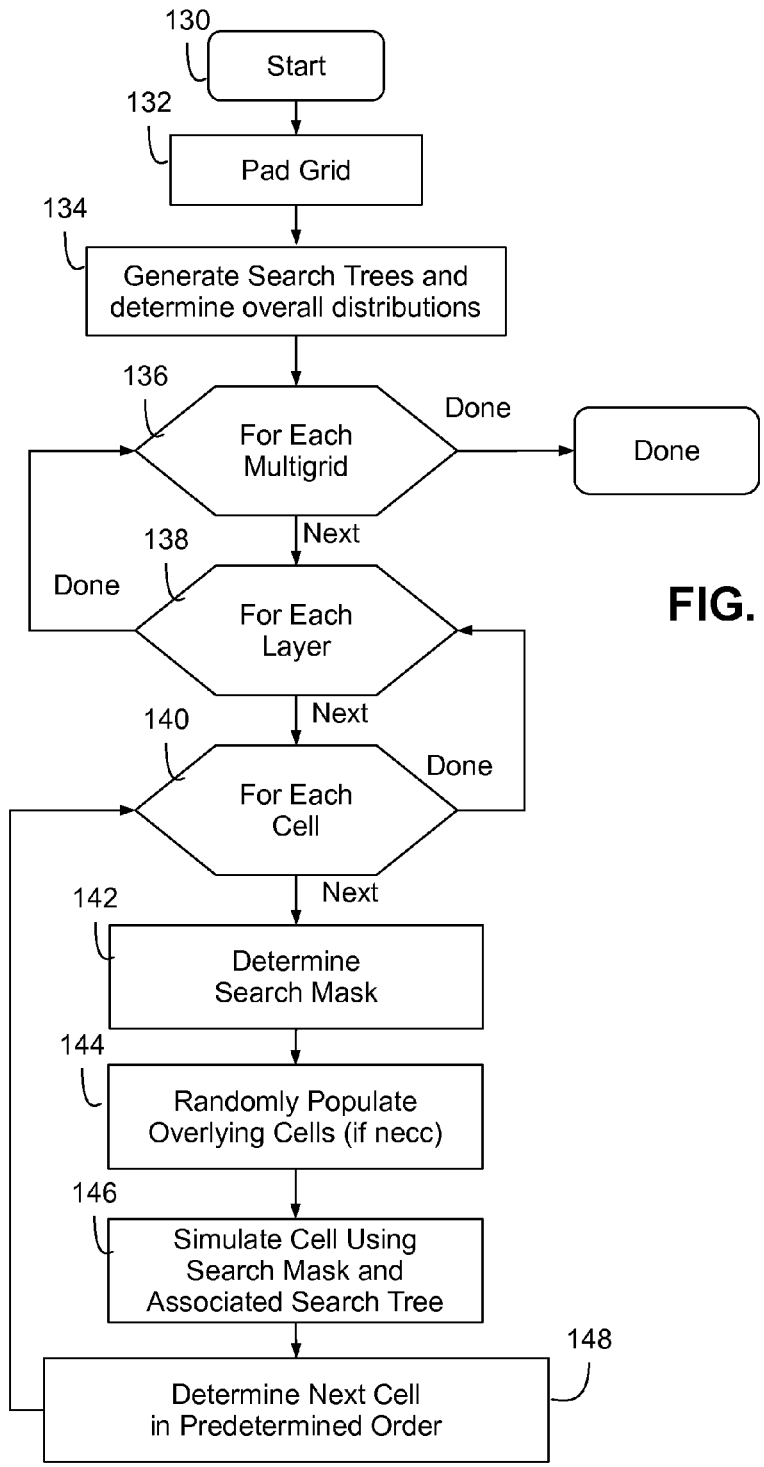
FIG. 17 is a flowchart illustrating the program flow of a simulation routine capable of being executed by the system of FIG. 1.

Now turning to FIG. 17, this figure illustrates an exemplary routine 130 that may be executed by computer 10 of FIG. 1 to implement one embodiment of a multipoint geostatistics simulation incorporating the techniques described herein. In this routine, it is assumed that a sequential path is utilized for each multigrid and subgrid therein, and as such, the configuration of the search masks for each subgrid/multigrid combination may be determined prior to simulation. In addition, a training image, constructed from at least a one-dimensional array of discrete property values, is used as an input to the routine. The discrete values in the training image depict the spatial relationship and variability considered to be typical of an n-dimensional surface to be modeled.

Routine 130 begins in block 132 by padding the simulation grid, if so desired. Next, in block 134, search trees are generated for the simulation, one for each subgrid of each multigrid. Thus, if there are n multigrids, with each multigrid other than the coarsest multigrid having m subgrids, the total number of search trees generated would be $((n-1) \times m)+1$ search trees, each specific to a particular subgrid/multigrid combination. Each search tree represents the probability of occurrence of combinations of values of a discrete property value, and is specific to a particular search mask or search neighborhood. The search tree may be constructed, for example, by counting the occurrences of different combinations of values in the search neighborhood defined by the associated search mask in the training image.

In addition, as shown in block 134, overall or global probability distributions may also be calculated when search trees are generated, e.g., by tracking the number of each category in the overall training image. As noted above, the probability distributions may be used to randomly assign values to outlying cells of a search mask proximate the boundaries of the simulation grid based upon a global probability of each category.

Next, blocks 136, 138 and 140 initiate a nested series of FOR loops to loop between each multigrid, each layer in each multigrid, and each cell in each layer of each multigrid. In this regard, each layer refers to layers in the plane of the i and j dimensions, such that each loop of block 138 progresses downward in the k dimension. In addition, in this embodiment, the ordered path proceeds within each layer in a left-to-right, top-to-bottom manner, e.g., as illustrated in FIG. 4. For each such cell, block 142 determines the search mask to be used for that cell, based upon the subgrid associated with that cell. Next, if the search mask extends beyond the simulation grid, the overlying cells or locations in the search mask that would otherwise be unassigned are populated with random values based on the overall probability distributions determined in block 134.

Next, block 146 simulates the cell using the determined search mask and the search tree associated with that search mask, using any number of suitable multipoint simulation techniques and based upon those neighboring cells matching the search mask. Block 148 then determines the next cell in the predetermined order, and control returns to block 140 to process the next cell. Once all cells, in all layers, of all multigrids have been simulated, routine 130 is complete. It will be appreciated that implementation of routine 130 in computer 10 would be well within the abilities of one of ordinary skill in the art having the benefit of the instant disclosure. Moreover, other routines may be utilized to implement the concepts disclosed herein in other embodiments.

Parallel Multipoint Geostatistics Simulation

Another technique that may be utilized to enhance the performance and computational efficiency of a computer-implemented multipoint geostatistics simulation incorporates parallel processing to employ a plurality of threads to concurrently simulate a plurality of unassigned cells in a simulation grid. In one embodiment, parallel computing principles are utilized to parallelize a pre-determined (as opposed to random) path through unassigned cells, e.g., using the path illustrated in FIG. 4.

In the illustrated embodiments, the workload associated with a parallel multipoint geostatistics simulation is distributed among a plurality of threads, e.g., one or more master threads and a plurality of slave threads. Threads utilized to manage the overall simulation process are termed "master" threads herein, while "slave" threads are used to perform the actual simulation of selected unassigned cells. It will be appreciated, however, that a given thread may operate as both a master thread and a slave thread, or may switch between these roles at different times. Therefore, the terms "master" and "slave" should not be utilized to limit the functionality of any thread.

Program code running in a master thread (referred to herein as "master program code") typically oversees the overall simulation process, maintains the ordered path through the simulation grid, and schedules the simulation of unassigned cells by the plurality of slave threads. In addition, as will become more apparent below, the master program code may also predict values for unassigned cells and pass these predictions to slave threads to enable the slave threads to perform simulations using predicted data, as well as compare simulation results against the predicted values so that any mispredictions will trigger re-simulation of any affected cells.

However, as shown by example two-dimensional simulation grid 200 in FIG. 18, from the perspective of each slave thread in the illustrated embodiment, program code the slave thread (referred to herein as "slave program code") performs a simulation on a single cell at a time, e.g., the center cell designated $U_c$.

As noted above, the master program code manages all slave threads, and may include functionality to limit the number of concurrent slave threads based upon a statically defined maximum number. The maximum number may be user defined or chosen automatically. In other embodiments, the maximum number may be dynamically controlled, or operating system or firmware may be used to control the number of concurrently executing slave threads.

Based on the maximum or desired number of concurrent slave threads, the master program code oversees the simulation of unassigned cells in a predetermined order, e.g., using any of the approaches discussed above. Furthermore, the master program code groups unassigned cells into sets, and spawns or otherwise initiates the execution of a number of slave threads suitable for handling the sets of unassigned cells, typically up to any specified maximum number of slave threads. Each slave thread is then provided with its own copy of the simulation grid and a particular unassigned cell ($U_c$) to simulate, and each slave thread returns to the master program code a simulated value for its associated $U_c$. As will become more apparent below, each slave thread also assumes that every cell in the predetermined order has a value.

FIG. 19, for example, shows an example of a partially simulated 5×5 grid where the maximum number of concurrent slave threads is set at four. Assuming no slave threads are currently running, the master program code may proceed with simulation of the unassigned cells by spawning slave threads for each center cell $U_1$, $U_2$, $U_3$, and $U_4$. However, because at this point cell $U_1$ has not been simulated, the other slave threads typically will not have all of the assumed information necessary to perform their own simulations. As such, and as will become more apparent below, a discrete-value-prediction algorithm may be used in the illustrated embodiment to predict values for any unassigned cells as needed for performing simulations in any slave threads.

A discrete-value-prediction algorithm in the illustrated embodiment is an algorithm that predicts one value out of a plurality of distinct possible values. Thus, for example, in the case of geostatistics modeling, a facies-prediction algorithm may be used, such that the discrete-value-prediction algorithm selects one out of the possible facies to which an unassigned cell may be assigned. Such a prediction algorithm may be static or dynamic, and may rely on any information that is available at the time of simulation (e.g., by the master program code). Different suitable prediction algorithms will be discussed in detail hereinafter.

In the illustrated embodiment, the master program code may generate and maintain predicted values for each cell. Thus, for the example in FIG. 19, a prediction algorithm in the master program code may predict that $U_1=0$, $U_2=0$, $U_3=0$, and $U_4=1$. The master program code may then spawn slave threads for each of these center cells, with any needed value predictions provided to the slave threads. The master program code may then wait for the slave thread simulating $U_1$ to return a value. If this value is the same as the predicted value (in this case 0), then the master program may record that value into a master simulation grid. If this value is different than the predicted value, indicating a misprediction, the master program code may instead halt or stop all of the other slave threads for the other unassigned cells in the set (as at this point they have been determined to be executing with incorrect assumptions), record the simulated value into the master simulation grid, and then start new slave threads to effectively restart the simulation on the other unassigned cells in the set, but with the determined simulated value for $U_1$ used in the simulation instead of the previously predicted value.

It is believed that this parallel and predictive approach provides an execution time improvement because the overhead of the method on a per-cell basis is comparable to a non-parallel simulation algorithm, and if the discrete-value-prediction algorithm is right even once, there will be a speed improvement. Even if a random number generator was used as the prediction algorithm, it would be expected that the prediction would be correct about one out of every m times, where m is the number of possible facies in the simulation.

Figure 20:
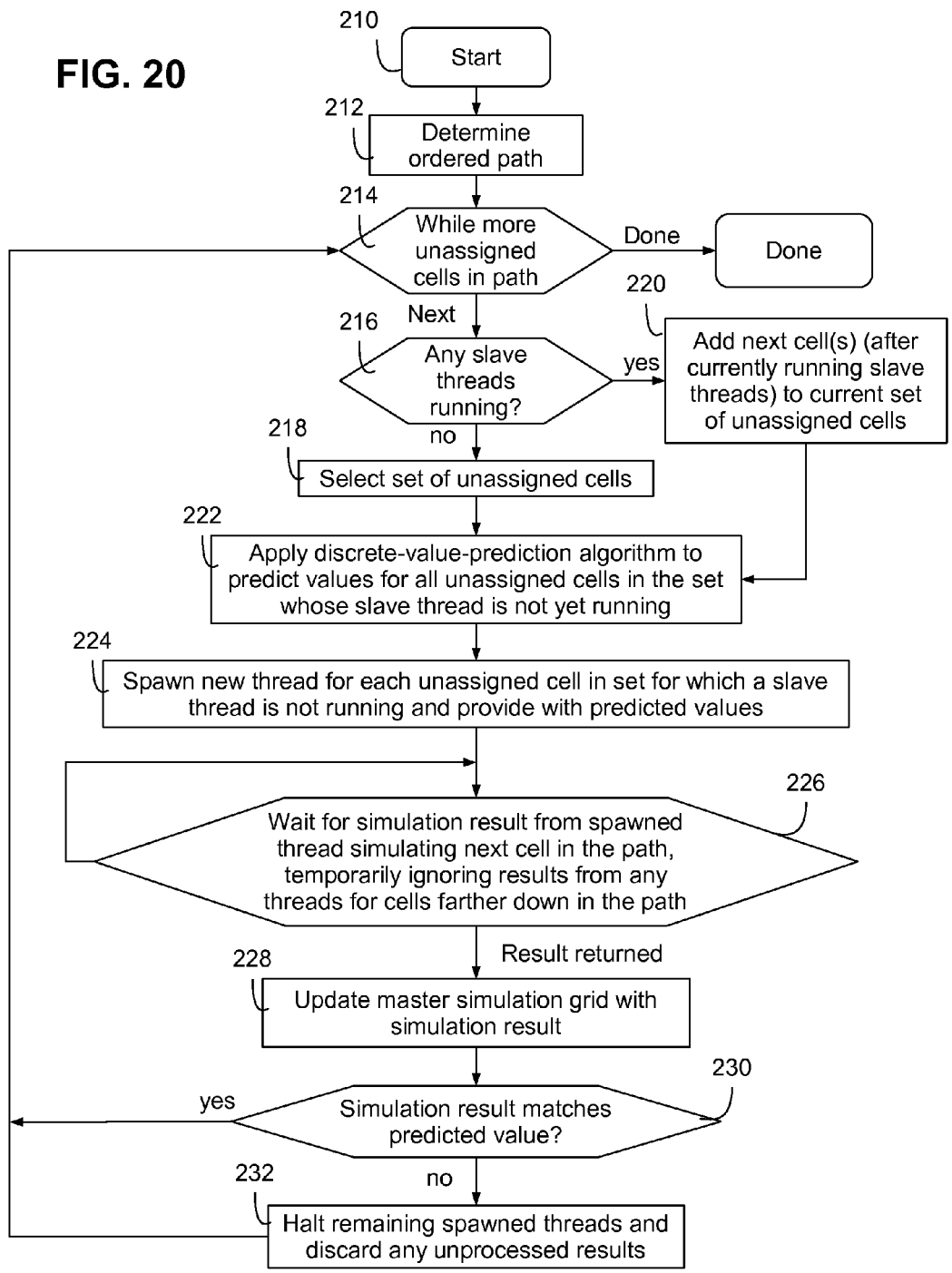
FIG. 20 is a flowchart illustrating the program flow of a simulation routine capable of being executed by a master thread in the system of FIG. 1.

Now turning to FIG. 20, this figure illustrates an exemplary routine 210 that may be executed master program code running in a master thread 40 of computer 10 of FIG. 1 to implement one embodiment of a parallel multipoint geostatistics simulation incorporating the techniques described herein. In this routine, it is assumed that a sequential path is utilized, and that a training image, constructed from at least a one-dimensional array of discrete property values, is used as an input to the routine. The discrete values in the training image depict the spatial relationship and variability considered to be typical of an n-dimensional surface to be modeled.

Routine 210 begins in block 212 by determining the ordered path to use to proceed through the simulation grid. Next, in block 214, while unassigned cells remain in the ordered path, control passes to block 216 to first determine whether any slave threads are currently running. If not, control passes to block 218 to select a set of unassigned cells to be concurrently simulated. As noted above, the number of cells in the set may be based on a defined maximum number of concurrent slave threads, or may otherwise be controlled for various performance-related reasons.

Otherwise, if any slave threads are already running, control passes to block 220 to add the next unassigned cell or cells in the ordered path (after those associated with the currently running slave threads) to the set. As with the initial set, the number of cells to add to the set may be based on a defined maximum number of concurrent slave threads, or may otherwise be controlled for various performance-related reasons.

Next, upon completion of either block 218 or block 220, control passes to block 222, where a discrete-value-prediction algorithm is applied to predict values for all unassigned cells needed for simulating the various cells in the selected set, e.g., for all unassigned cells in the set for which a slave thread is not currently running. In other embodiments, predicted values may be determined for each of the unassigned cells in the set and/or any other neighboring unassigned cells to be used in the simulations. In still other embodiments, predicted values may be generated for any combination of unassigned cells found at least in the neighborhood (i.e., in the same general area of the simulation grid) of the cells being simulated.

Next, in block 224, a new slave thread is spawned for each unassigned cell in the set for which a slave thread is not running. In addition, at this time the predicted values determined in block 222 are provided to each of the newly spawned slave threads. It will be appreciated that all predicted values may be provided to all slave threads, or alternatively, only those predicted values relevant to the simulation of the particular unassigned cells for different slave threads may be provided to those slave threads.

Also, in the illustrated embodiment, each spawned thread is provided with a separate copy of the simulation grid. As such, the predicted values may be provided by inserting the predicted values at the appropriate positions in the thread-specific simulation grid. In other embodiments, the slave threads may share a common copy of the simulation grid with one another and/or the master thread. It will also be appreciated that a wide variety of data structures and data communication, message passing and/or shared memory algorithms and architectures may be used to effectively provide the predicted values, the simulation grid data, and any other required data to each slave thread to enable that slave thread to perform the requested simulation. For example, data may be passed either through shared memory (a pointer to a location in memory where the data already sits), or message passing (passing a copy of the entire data/data structure to the slave thread).

Next, in block 226, the master program code waits for simulation results to be returned from the spawned slave thread corresponding to the next unassigned cell in the path. Given that multiple slave threads may be concurrently simulating multiple cells, if any slave thread associated with an unassigned cell farther down the path returns a result before the next unassigned cell in the path, the result returned by that slave thread is stored, but is otherwise temporarily ignored, i.e., processing of the result is deferred until all unassigned cells upstream of that cell have been successfully simulated.

As shown in block 228, whenever a result is returned for a cell, the master simulation grid is updated with the simulation value returned as the result. Next, block 230 determines whether the result for the cell matches the predicted value that was determined for that cell. If the prediction was correct, control returns to block 214 to initiate simulation of additional unassigned cells.

Otherwise, if a mismatch is found, indicating a misprediction, block 230 passes control to block 232 to halt any spawned threads that are still in the process of simulation, as well as discard any unprocessed simulation results for unassigned cells downstream of the mispredicted cell for which simulation results have already been returned. Control then returns to block 214 to initiate simulation of additional unassigned cells. Since the simulations of the unassigned cells downstream of the mispredicted cell in the path were not completed, however, passing control to block 214 will effectively restart the simulations of these downstream cells and respawn new slave threads as necessary. Of note, since the cell for which the result was returned has been simulated, the restarted simulations will use the simulation value for that cell in lieu of the previously mispredicted value. Once no more unassigned cells remain in the path, routine 210 is complete.

Routine 210 may be modified in a number of manners in various embodiments. For example, in some embodiments one or more predicted values may be regenerated after a mispredict. In addition, in some embodiments different thread management techniques may be utilized. For example, in some embodiments, slave threads may be transient in nature and tasked with simulating only a single unassigned cell during their lifetimes, such that threads that return simulation results terminate automatically, and halting of a slave thread causes that thread to terminate. In such embodiments, therefore, it may be desirable to respawn new threads for all of the cells in any selected or reselected set of cells.

In other embodiments, however, slave threads may be more persistent, and may be capable of receiving requests for simulating cells, simulating those cells, returning results, and then waiting for future requests. In particular, where each slave thread maintains a separate copy of the simulation grid, it may be desirable to minimize the overhead of creating and managing the separate copies of the simulation grid by allowing each slave thread to receive updates from the master program code so that the slave threads can locally add prediction values or update unassigned cells or prediction values with simulation results from other slave threads. In such embodiments, therefore, halting of a slave thread while it is performing a simulation may not result in termination of the slave thread, and instead just may result in handling of a particular request being terminated so that the slave thread is available to process a new request for the same or a different unassigned cell.

FIG. 21 next illustrates a routine 240 that may be executed by slave program code running in a slave thread 42 of computer 10 of FIG. 1. Routine 240 receives as input from the master thread an unassigned cell to be simulated, as well as any predicted values required for the simulation. In some embodiments, routine 240 may also receive the current data in the simulation grid. Alternatively, routine 240 may locally construct a separate copy of the simulation grid.

Routine 240 begins in block 242 by performing the requested simulation on the unassigned cell using the separate copy of the simulation grid and any predicted values provided to the associated slave thread. Block 244 then returns the simulation result, and routine 240 is complete. As noted above, in some instances the associated slave thread may terminate, while in other instances the slave thread may remain active and await further simulation requests from the master thread.

As noted above, a discrete-value-prediction algorithm may be used in some embodiments to predict values of unassigned cells in a simulation grid prior to concurrently simulating a set of unassigned cells. In some embodiments, for example, a random (which may actually be pseudorandom in nature) algorithm may be used to randomly predict a value from among the possible values for a cell.

In other embodiments, a prediction algorithm may be used to predict the most likely facies based on the training image. As such, whichever facies has the most cells set to that facies in the training image, that facies could be predicted for all unassigned cells.

In still other embodiments, a prediction algorithm may predict facies values randomly based on training image probability, i.e., using the probability P of a certain facies value $f_x$ appearing based on the ratio of the number of cells in the training image with a facies value of $f_x$ to the total number of cells in the training image. In such embodiments, a prediction algorithm may use a random number generator and the probabilities $P(f_x)$ to choose a random facies value based on training image probability.

In other embodiments, a prediction algorithm may be dynamic in nature, and may predict based on the last simulated value, e.g., by predicting the last validly simulated value. FIG. 22, for example, illustrates an example of such a prediction algorithm where a cell is capable of being assigned one of three different values $f_0$, $f_1$ and $f_2$. A finite state machine (FSM) 250 shows three states $S_0$, $S_1$, and $S_2$, each with output $f_0$, $f_1$ and $f_2$. At any given point, the algorithm is in one of the three states, and when a new input is available (a slave thread finishes executing and produces a simulation result) then the FSM follows the arrow with that simulation result as its label to the next state. As can be seen, the current state and previous state may be the same.

Figure 23:
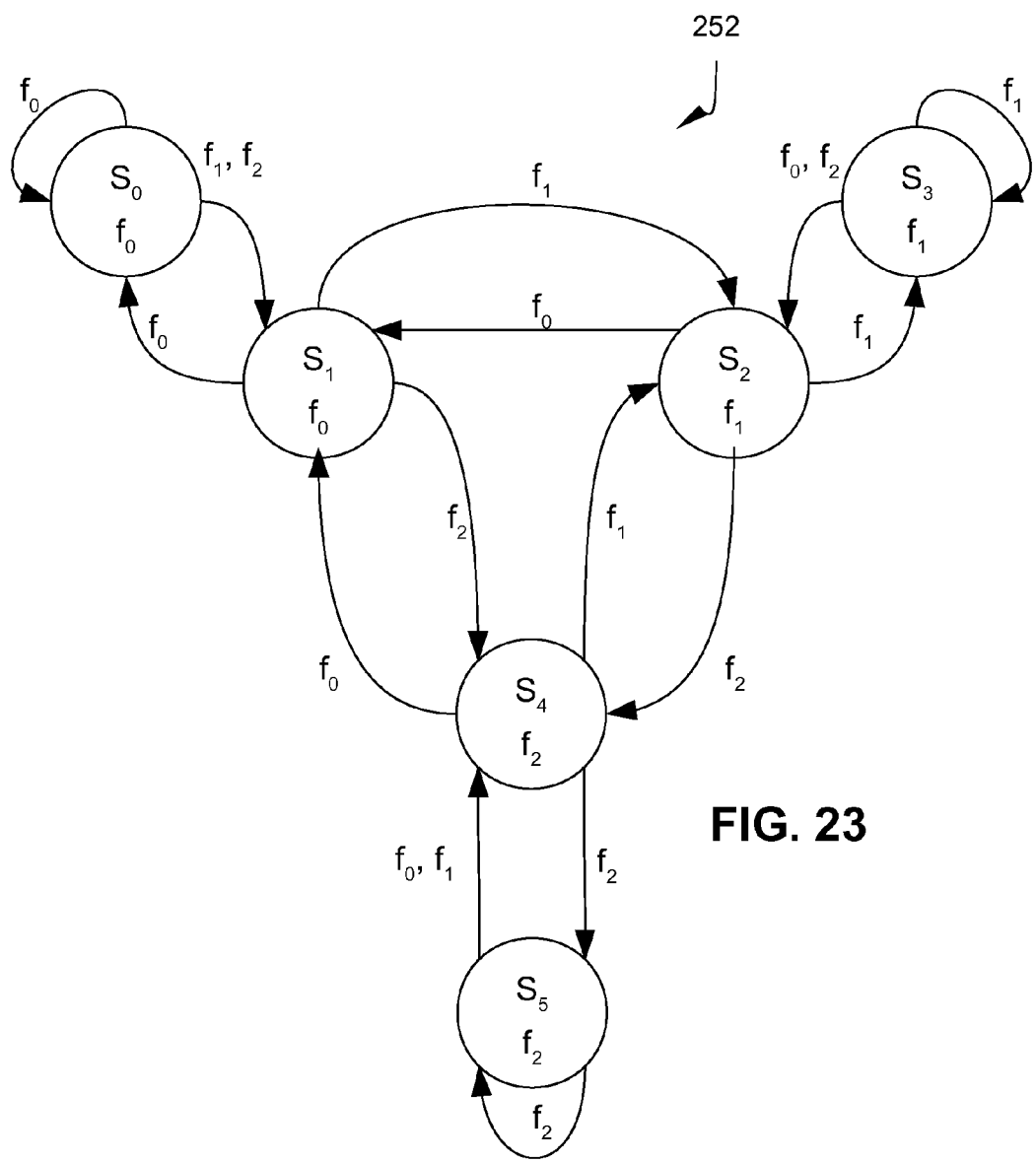
FIG. 23 is a state diagram illustrating a bimodal discrete-value prediction algorithm for use by the simulation routine of FIG. 21.

In still other embodiments, a bimodal prediction algorithm may be used. In bimodal prediction, each possible value has two states corresponding to strongly taken and weakly taken. An example of bimodal discrete-value-prediction for three possible values is shown in FIG. 23, where a FSM 252 includes states $S_0$-$S_1$, with state $S_0$ corresponding to a strongly taken $f_0$ value, state $S_1$ corresponding to a weakly taken $f_0$ value, state $S_2$ corresponding to a weakly taken $f_1$ value, state $S_3$ corresponding to a strongly taken $f_1$ value, state $S_4$ corresponding to a weakly taken $f_2$ value, and state $S_5$ corresponding to a strongly taken $f_2$ value.

Any one of the above prediction algorithms, or any other algorithm that outputs a facies value from among the possible values may be used in other embodiments of the invention.

Additional modifications may also be made consistent with the invention. For example, slave threads may be requested to handle multiple cell simulations at a time, and various queuing mechanisms may be used to allocate unassigned cells to slave threads. For example, slave threads may be organized into a pool and a shared queue or dedicated queues may be used to store requests that are taken off the queues as slave threads complete prior simulations.

In addition, it will be appreciated that the herein-described parallel multiple point geostatistics simulation techniques may be integrated for use with non-symmetric search masks, multigrids, sub-grids, and any of the other techniques disclosed above.

There have been described and illustrated herein a computer-based method for automatically computing the results of a multiple point geostatistics simulation with improved computational efficiency, enabling for example the modeling of discrete properties in a subsurface. Example applications of these methods include the modeling of discrete geological properties for petroleum geology and reservoir simulation, groundwater hydrology, $CO_2$ sequestration, geological outcrop modeling, and 3D image reconstruction, among others. While particular embodiments have been described, it is not intended that the invention be limited thereto, as it is intended that the invention be as broad in scope as the art will allow and that the specification be read likewise. It will therefore be appreciated by those skilled in the art that yet other modifications could be made without deviating from its spirit and scope as claimed.

What is claimed is:

1. A method of performing geostatistics modeling, the method comprising:
  in master program code executing in at least one thread, running a parallel multiple point statistics simulation of an n-dimensional grid of cells by:
    determining an ordered path through the n-dimensional grid;
    selecting a set of unassigned cells along the ordered path;
    applying a discrete-value-prediction algorithm to predict values for multiple cells to be used in simulating the set of unassigned cells; and
    initiating execution of slave program code on each of a plurality of threads to initiate concurrent simulation of the set of unassigned cells by the plurality of threads, wherein the master program code associates each of the unassigned cells in the set of unassigned cells with a thread from among the plurality of threads and provides at least a subset of the predicted values to each of the plurality of threads for use in simulation;
  in each of the plurality of threads, executing the slave program code, including:
    receiving the associated unassigned cell from the master program code;
    storing in a separate copy of the n-dimensional grid from that of the master program code any predicted values or results for other unassigned cells provided by the master program code;
    performing multiple point statistics simulation of the associated unassigned cell using the separate copy of the n-dimensional grid to generate a result; and
    returning the result to the master program code; and
  in the master program code:

in response to receiving a first result from a first thread among the plurality of threads and associated with a first unassigned cell from among the set of unassigned cells, assigning the first result to the first unassigned cell and comparing the first result with a first predicted value for the first unassigned cell; and in response to a mismatch between the first result and the first predicted value:

halting at least one of the plurality of threads from which a result has not yet been received; and initiating execution of the slave program code on at least one thread to restart simulation of at least one unassigned cell from the set of unassigned cells using the first result from the first thread instead of the first predicted value.

2. A method of performing geostatistics modeling, comprising:

running a parallel multiple point statistics simulation of an n-dimensional grid by concurrently simulating cells in the n-dimensional grid using a plurality of threads to determine a simulation value to assign to each of a plurality of cells in the n-dimensional grid;

prior to concurrently simulating a set of cells from among the plurality of cells, predicting values for at least a subset of the set of cells such that a first cell from among the set of cells is simulated using a predicted value for a second cell from among the set of cells; and in response to determining from simulation of the second cell that the predicted value for the second cell was mispredicted, restarting simulation of the first cell with the predicted value for the second cell replaced with a simulation value determined from simulation of the second cell.

3. The method of claim 2, further comprising determining a non-symmetric search mask that excludes at least one not-yet-simulated cell from the search mask during simulation, wherein running the parallel multiple point statistics simulation includes simulating cells in the n-dimensional grid using the non-symmetric search mask.

4. The method of claim 3, wherein determining the non-symmetric search mask includes determining at least one non-symmetric search mask for each multigrid among a plurality of multigrids defined in the n-dimensional grid, wherein the non-symmetric search masks are configured such that each cell in the n-dimensional grid that is simulated after all of the cells in the coarsest multigrid have been simulated is simulated using only previously-simulated cells in the simulation.

5. The method of claim 2, wherein running the parallel multiple point statistics simulation includes simulating cells in the n-dimensional grid in a predetermined order.

6. The method of claim 2, further comprising:

initiating concurrent simulation of the first and second cells respectively on first and second threads among the plurality of threads; and providing the predicted values to the first and second threads prior to concurrently simulating the first and second cells such that the first cell is simulated using the predicted value for the second cell.

7. The method of claim 6, wherein initiating the concurrent simulation of the first and second cells includes spawning the first and second threads, and wherein the method further comprises, in response to determining that the predicted value for the second cell was mispredicted:

terminating the first thread; and spawning a new thread such that restarting simulation of the first cell is performed in the new thread.

8. The method of claim 6, wherein the first and second threads are configured to access separate copies of the n-dimensional grid, and wherein the method further comprises updating a master copy of the n-dimensional grid with the simulation value determined from simulation of the second cell.

9. The method of claim 6, wherein initiating concurrent simulation, predicting the values, providing the predicted values and restarting simulation are performed by master program code executing in a master thread separate from the plurality of threads.

10. The method of claim 9, wherein the master program code is configured to limit a number of concurrently executing threads.

11. The method of claim 2, wherein predicting the values includes performing a discrete-value-prediction algorithm.

12. The method of claim 11, wherein the discrete-value-prediction algorithm comprises a random algorithm.

13. The method of claim 11, wherein the discrete-value-prediction algorithm selects predicted values based upon a most frequent value in a training image.

14. The method of claim 11, wherein the discrete-value-prediction algorithm selects predicted values based upon probabilities associated with a training image.

15. The method of claim 11, wherein the discrete-value-prediction algorithm selects a dynamic algorithm that predicts a predicted value based on a last simulated value.

16. The method of claim 11, wherein the discrete-value-prediction algorithm comprises a bimodal prediction algorithm.

17. The method of claim 2, wherein the n-dimensional grid is representative of a subsurface, and wherein running the parallel multiple point statistics simulation comprises selecting a discrete subsurface property from among a plurality of discrete subsurface properties for each cell in the grid.

18. The method of claim 2, wherein running the parallel multiple point statistics simulation includes simulating at least one cell using conditioning data assigned to a neighboring cell in the non-symmetric search mask.

19. An apparatus, comprising:

at least one processor; and program code configured upon execution by the at least one processor to perform geostatistics modeling by:

running a parallel multiple point statistics simulation of an n-dimensional grid by concurrently simulating cells in the n-dimensional grid using a plurality of threads to determine a simulation value to assign to each of a plurality of cells in the n-dimensional grid;

prior to concurrently simulating a set of cells from among the plurality of cells, predicting values for at least a subset of the set of cells such that a first cell from among the set of cells is simulated using a predicted value for a second cell from among the set of cells; and in response to determining from simulation of the second cell that the predicted value for the second cell was mispredicted, restarting simulation of the first cell with the predicted value for the second cell replaced with a simulation value determined from simulation of the second cell.

20. The apparatus of claim 19, wherein the program code is configured to simulate cells in the n-dimensional grid in a predetermined order.

21. The apparatus of claim 19, wherein the program code is further configured to:

initiate concurrent simulation of the first and second cells respectively on first and second threads among the plurality of threads; and provide the predicted values to the first and second threads prior to concurrently simulating the first and second cells such that the first cell is simulated using the predicted value for the second cell.

22. The apparatus of claim 21, wherein the program code is configured to initiate the concurrent simulation of the first and second cells by spawning the first and second threads, and in response to determining that the predicted value for the second cell was mispredicted, halt the first thread and spawn a new thread such that restarting simulation of the first cell is performed in the new thread.

23. The apparatus of claim 21, wherein the first and second threads are configured to access separate copies of the n-dimensional grid, and wherein the program code is configured to update a master copy of the n-dimensional grid with the simulation value determined from simulation of the second cell.

24. The apparatus of claim 19, wherein the program code is configured to predict the values by performing a discrete-value-prediction algorithm selected from the group consisting of a random algorithm, an algorithm that selects predicted values based upon a most frequent value in a training image, an algorithm that selects predicted values based upon probabilities associated with a training image, a dynamic algorithm that predicts a predicted value based on a last simulated value, and a bimodal prediction algorithm.

25. A program product, comprising:

a non-transitory computer readable storage medium; and program code resident on the computer readable storage medium and configured upon execution to perform geostatistics modeling by:

running a parallel multiple point statistics simulation of an n-dimensional grid by concurrently simulating cells in the n-dimensional grid using a plurality of threads to determine a simulation value to assign to each of a plurality of cells in the n-dimensional grid;

prior to concurrently simulating a set of cells from among the plurality of cells, predicting values for at least a subset of the set of cells such that a first cell from among the set of cells is simulated using a predicted value for a second cell from among the set of cells; and in response to determining from simulation of the second cell that the predicted value for the second cell was mispredicted, restarting simulation of the first cell with the predicted value for the second cell replaced with a simulation value determined from simulation of the second cell.

* * * * *